United States Patent [19]
Anderson et al.

[11] Patent Number: 5,455,070
[45] Date of Patent: Oct. 3, 1995

[54] VARIABLE RATE DISTRIBUTION GAS FLOW REACTION CHAMBER

[75] Inventors: Roger N. Anderson, San Jose; Paul R. Lindstrom, Aptos, both of Calif.; Wayne Johnson, Phoenix, Ariz.

[73] Assignee: Applied Materials, Inc., Santa Clara, Calif.

[21] Appl. No.: 122,270

[22] Filed: Sep. 16, 1993

Related U.S. Application Data

[62] Division of Ser. No. 879,545, May 4, 1992, Pat. No. 5,269,847, which is a continuation of Ser. No. 571,957, Aug. 23, 1990, abandoned.

[51] Int. Cl.$^6$ .................... C23C 16/00; H01L 21/306
[52] U.S. Cl. .................. 427/248.1; 427/255.1; 427/255.2; 156/643.1; 156/646.1; 216/38
[58] Field of Search ............. 427/248.1, 255.1, 427/255.2; 156/643, 646

[56] References Cited

U.S. PATENT DOCUMENTS

| | | | |
|---|---|---|---|
| 4,123,316 | 10/1978 | Tsuchimoto | 156/643 |
| 4,307,283 | 12/1981 | Zajac | 219/121 |
| 4,392,915 | 7/1983 | Zajac | 156/643 |
| 4,539,068 | 9/1985 | Takagi et al. | 156/614 |
| 4,612,077 | 7/1985 | Tracy et al. | 156/345 |
| 4,736,705 | 4/1988 | Weyburne | 118/725 |
| 4,795,529 | 1/1989 | Kawasaki et al. | 156/643 |
| 4,818,326 | 4/1989 | Liu et al. | 156/345 |
| 4,872,947 | 10/1989 | Wang et al. | 156/643 |
| 4,913,929 | 4/1990 | Moslehi et al. | 427/39 |
| 5,108,792 | 4/1992 | Anderson et al. | 427/248.1 |

FOREIGN PATENT DOCUMENTS

| | | |
|---|---|---|
| 0027578 | 4/1981 | European Pat. Off. . |
| 0254654 | 1/1988 | European Pat. Off. . |
| 56-13718 | 2/1981 | Japan . |
| 60-189928 | 9/1985 | Japan . |
| 61-100935 | 5/1986 | Japan . |
| 61-1010120 | 5/1986 | Japan . |
| 89021718 | 8/1987 | Japan . |
| 63-161607 | 7/1988 | Japan . |
| 8912703 | 12/1989 | WIPO . |
| 9007019 | 6/1990 | WIPO . |

OTHER PUBLICATIONS

American Heritage Dictionary, pub. Houghton Mifflin, 1969 (3 pages) (no mo.).

*Primary Examiner*—Janyce Bell
*Attorney, Agent, or Firm*—Birgit E. Morris

[57] ABSTRACT

A wafer processing reactor having an input manifold to enable control of a process gas flow profile over a wafer that is being processed. Both process gas relative concentrations and flow rates can be controlled, thereby enabling an increased uniformity of processing across the wafer.

2 Claims, 5 Drawing Sheets

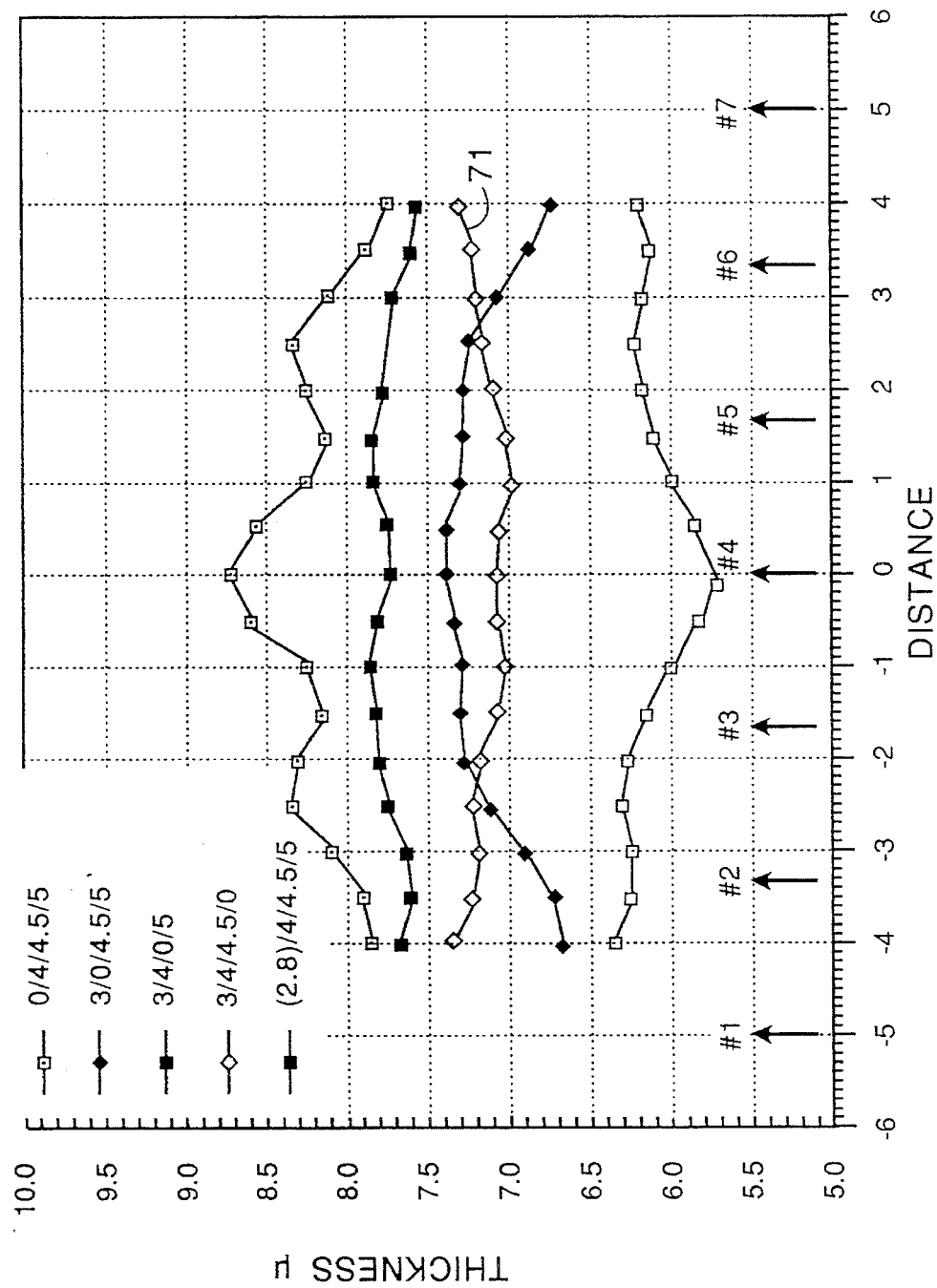

VARIABLE RATE DISTRIBUTION GAS FLOW REACTION CHAMBER

This is a division of application Ser. No. 07/879,545 filed May 4, 1992, U.S. Pat. No. 5,269,847 which is a continuation of Ser. No. 07/571,957 filed Aug. 23, 1990, now abandoned.

BACKGROUND OF THE INVENTION

This invention relates in general to reaction chambers and relates more particularly to the supply of reactant gases to such chambers.

In the figures, each element indicated by a reference numeral will be indicated by the same reference numeral in every figure in which that element appears. The first digit of any two or three digit reference numerals indicates the first figure in which its associated element is presented.

To remain price competitive in integrated circuit fabrication it is important to increase continually the throughput of a wafer processing system. Batch processing systems have been used to increase throughput. However, in state of the art devices it is necessary to utilize single wafer processing systems to achieve the processing uniformity needed to achieve state of the art feature sizes. For equipment utilized to achieve state of the art linewidths it is particularly important to achieve as high a uniformity of processing across the wafer as possible.

As the feature size of integrated circuits shrinks and the size of wafers increases, it becomes increasingly important to accurately control the rates of various wafer processing steps to achieve process uniformity across the entire wafer. The uniformity obtained by all process steps, including all plasma-processes and chemical vapor deposition processes, are affected by the distribution of process gases within the processing chamber. In many existing systems, process gases are injected into the processing chamber at a point that is remote from the wafer so that a uniform distribution of the gases is achieved before these gases reach the wafer. The wafer is typically located between the remote gas inlets and an exhaust port so that the reactant gases flow past the wafer. To further improve the uniformity of processing, many systems include the ability to rotate the wafer during processing to increase the uniformity of the time-averaged physical and chemical environment of the wafer during processing. However, to achieve improved process control it would be advantageous to have a greater degree of control over the distribution of gases within the reaction chamber than is now available.

SUMMARY OF THE INVENTION

In accordance with the illustrated preferred embodiment, a gas flow system is presented that enables accurate control of gas flow rates and composition across a wafer during processing, thereby enhancing the ability to control the distribution of wafer processing rates across the wafer. Although this gas flow system is applicable to batch processing systems, it is best implemented in single wafer processing systems. This gas flow system provides process gases from a gas inlet port adjacent to the wafer(s) so that the flow rates and concentrations of the gases at the wafer can be more accurately controlled. Preferably, the gases are applied near the edge of the wafer at one side of the wafer and flow across the wafer to an exhaust port located diametrically opposite across the wafer from the gas inlet port. Preferably, the spacing between the gas inlet port and the nearest edge of the wafer as well as the spacing between the exhaust port and the nearest edge of the wafer are small so that there is a reduced amount of deadspace in the system and so that control of the distribution of gases across the wafer is enhanced. Thus, it is advantageous for the reactor to include a cylindrical section that closely surrounds the sides of the wafer. The inlet port and exhaust port can be located in this cylindrical section to enable them to inject and exhaust, respectively, gases at the wafer.

A gas supply manifold is attached to the gas inlet port to enable the gas composition and flow rate to be varied across tile gas inlet port, thereby enabling control over the spatial distribution of gas composition and flow rates at the wafer surface. This gas supply manifold includes a set of gas injectors each of which is connected through flow controllers to associated gas sources. The gas inlet port is preferably in the shape of a thin slot that is parallel to the wafer so that this port supplies gases to tile immediate vicinity of the edge of the wafer. The exhaust port is also preferably in the shape of a thin exit slit that is parallel to the wafer so that this port exhausts gases from the immediate vicinity of the edge of the wafer.

In the gas inlet port, a number of vertical vanes can be included to provide physical strengthening of the inlet port. In addition, these vanes can prevent mixing of injected gases from different inlet jets of the gas supply manifold until these gases reach points closer to the edge of the wafer than the distance of the gas injectors from the edge of the wafer. Each pair of adjacent vanes defines the sides of a gas transport channel that prevents mixing of gases between different channels. Typically, there will be as many different gas transport channels as there are inlet gas injectors. At the inner ends of these channels, the gas inlet port narrows into a narrow inlet slit that is slightly wider than the diameter of wafers to be processed in this processing system. This enables some local mixing of the gases before these gases reach the vicinity of the wafer. This smooths the concentration and flow profiles of the inlet gases before they reach the wafer and yet enables a nonconstant concentration and flow profile to be achieved across the wafer.

A preheat susceptor ring can be included between the inlet slit and the wafer to preheat the injected gases before they reach the wafer. This ring preferably extends completely around the wafer so that it provides a symmetric temperature environment for the wafer. In a processing system in which elevated process temperatures are produced by intense light from a light source, the susceptor is selected to be of a material that is opaque to this light. It is also advantageous for this material to have a low thermal mass so that the temperature can be rapidly changed by the light sources.

If the gas flow and concentration profiles are constant across the gas inlet port, then an increased process rate results at the perimeter of the wafer. This occurs because the reactant concentrations are depleted as they flow across the wafer to process the wafer. This is particularly easy to see for the case in which a portion of these reactant gases deposit on the wafer, but it is also true for other processes, such as etching processes in which the reactant gases are used up during that process step. Therefore, in general, it is advantageous to have a greater concentration and/or a greater flow rate for the portion of the reactant gas stream that crosses near the center of the wafer. Preferably, the wafer is rotated to produce a temporally averaged, radially symmetric processing of the wafer even though the gas flow and/or concentration is not constant across the wafer.

Although the gas flow rate and wafer rotation rate are low enough that there will generally be nonturbulent gas flow within the reactor chamber, the complicated interaction between the various parameters limits the ability to accurately determine theoretically the desired flow and concentration profiles. This is particularly true in most preferred embodiments of reactors because of the complicated interaction between heating effects, rotation of the wafer, flow rates, concentrations, backflow of gases in the rotating wafer system, temperature decomposition of the gases and complex reactions between the reactant gases and the wafer. Such theoretical analysis can be a starting point, but optimization is generally achieved empirically.

DESCRIPTION OF THE FIGURES

FIG. 7 presents empirical plots of deposition thickness on a wafer as a function of wafer radius for several selections of gas flow rates into 7 different gas transport channels.

DESCRIPTION OF THE PREFERRED EMBODIMENT

Figure 1:
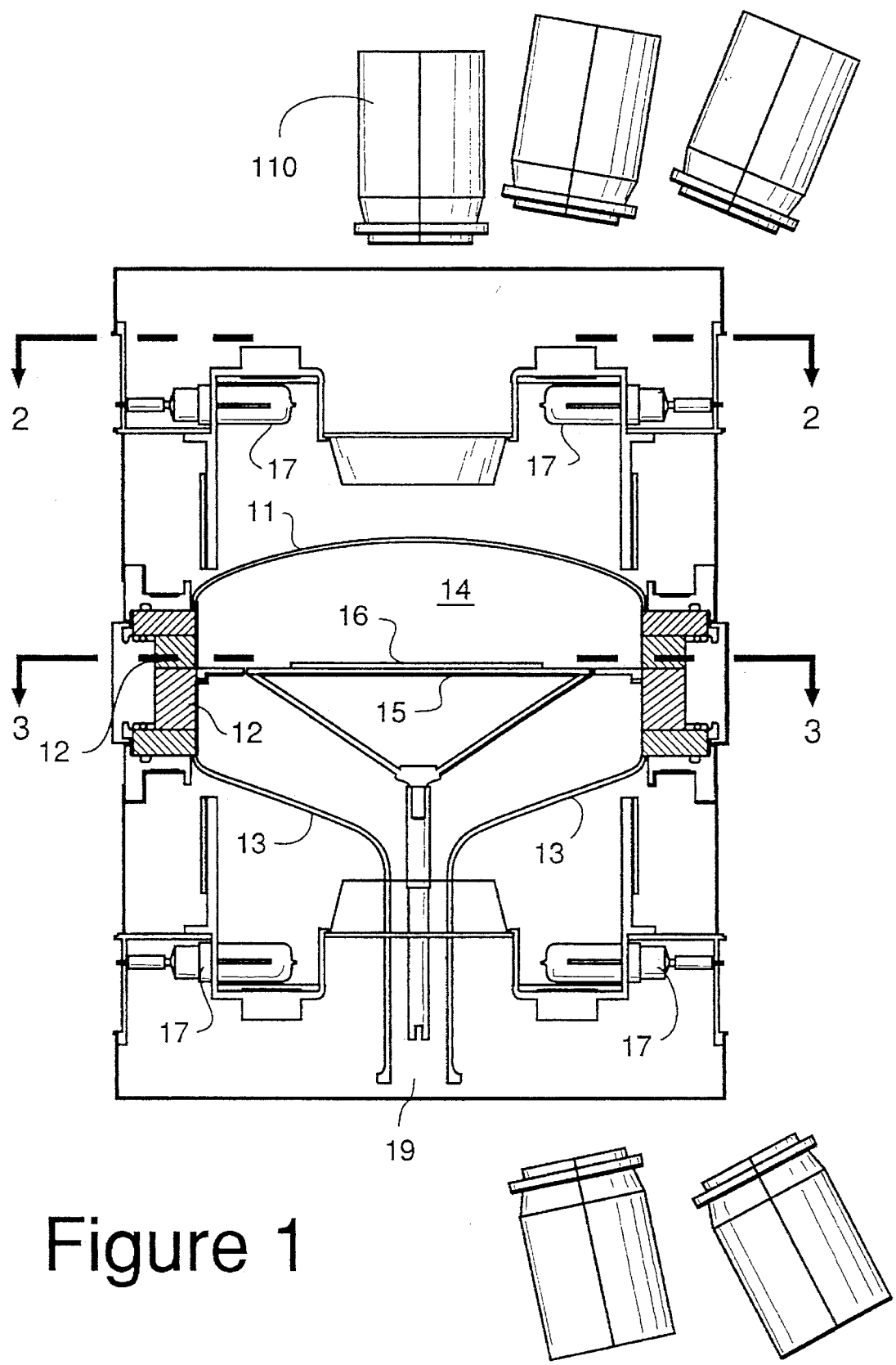
FIG. 1 is a side view of a wafer processing reactor in accordance with the present invention.

FIG. 1 is a side view of a wafer processing reactor in accordance with the present invention. Walls 11–13 enclose a reaction chamber 14 in which processing of wafers takes place. A wafer pedestal 15 within this chamber can be rotated to produce radially symmetric processing of wafers by producing a time-averaged environment for a wafer 16 that is centered on the rotation axis.

Figure 2:
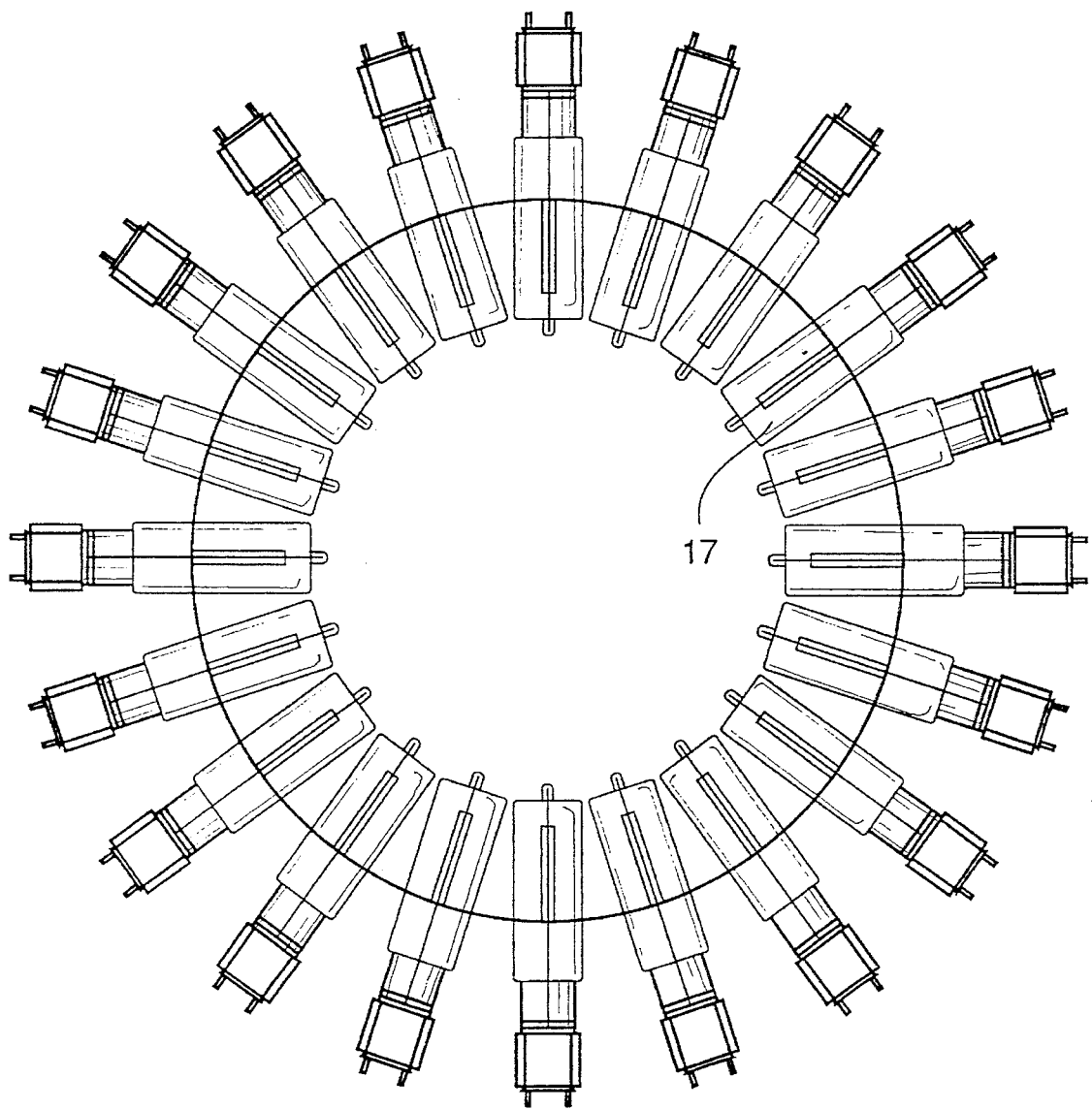
FIG. 2 is a top cross-sectional view of the wafer processing reactor of FIG. 1 illustrating an array of heating lamps utilized to heat the wafer.

Wafer 16 is heated by means of an array of lamps 17 that are distributed in a ring centered on an axis that passes perpendicularly through wafer 16. A top cross-sectional view of these lamps is presented in FIG. 2. The wafer pedestal is preferably of an opaque material that can withstand the processing temperatures so that light from lamps 17 heats the wafer even if the wafer is transparent to the light from lamps 17. In this embodiment, the pedestal is silicon carbide coated graphite.

To increase the rate at which the wafer can be thermally cycled, arrays of lamps 17 are included both above and below pedestal 15. To enable this light to reach the pedestal, walls 11 and 13 are transparent to the light from these lamps. A convenient choice of material for these walls is quartz because of its transparency, strength (to withstand pressure differences across these walls) and ability to withstand the elevated temperatures (typically 500–1,200 degrees Centigrade) utilized during wafer processing. Typical process pressures can be as low as a few Torr so that these walls need to withstand a full atmosphere of pressure. Sidewall 12 is typically a machined block of material such as quartz. In other applications, such as other CVD or etching processes, suitable choices of material include aluminum and stainless steel. Additional gases such as hydrogen or nitrogen can be injected through a gas inlet 19 into reaction chamber 14 to prevent the reactant gases from flowing into the bottom half of the process chamber. A set of infrared detectors 110 are utilized to measure the wafer temperature and provide feedback to a power source for lamps 17 to regulate the wafer temperature. A reactor of this type is illustrated in greater detail in copending patent application Ser. No. 07/441,416 entitled Double-Dome Reactor For Semiconductor Processing filed by Roger N. Anderson, et al on Mar. 9, 1990, now U.S. Pat. No. 5,108,792.

Figure 3:
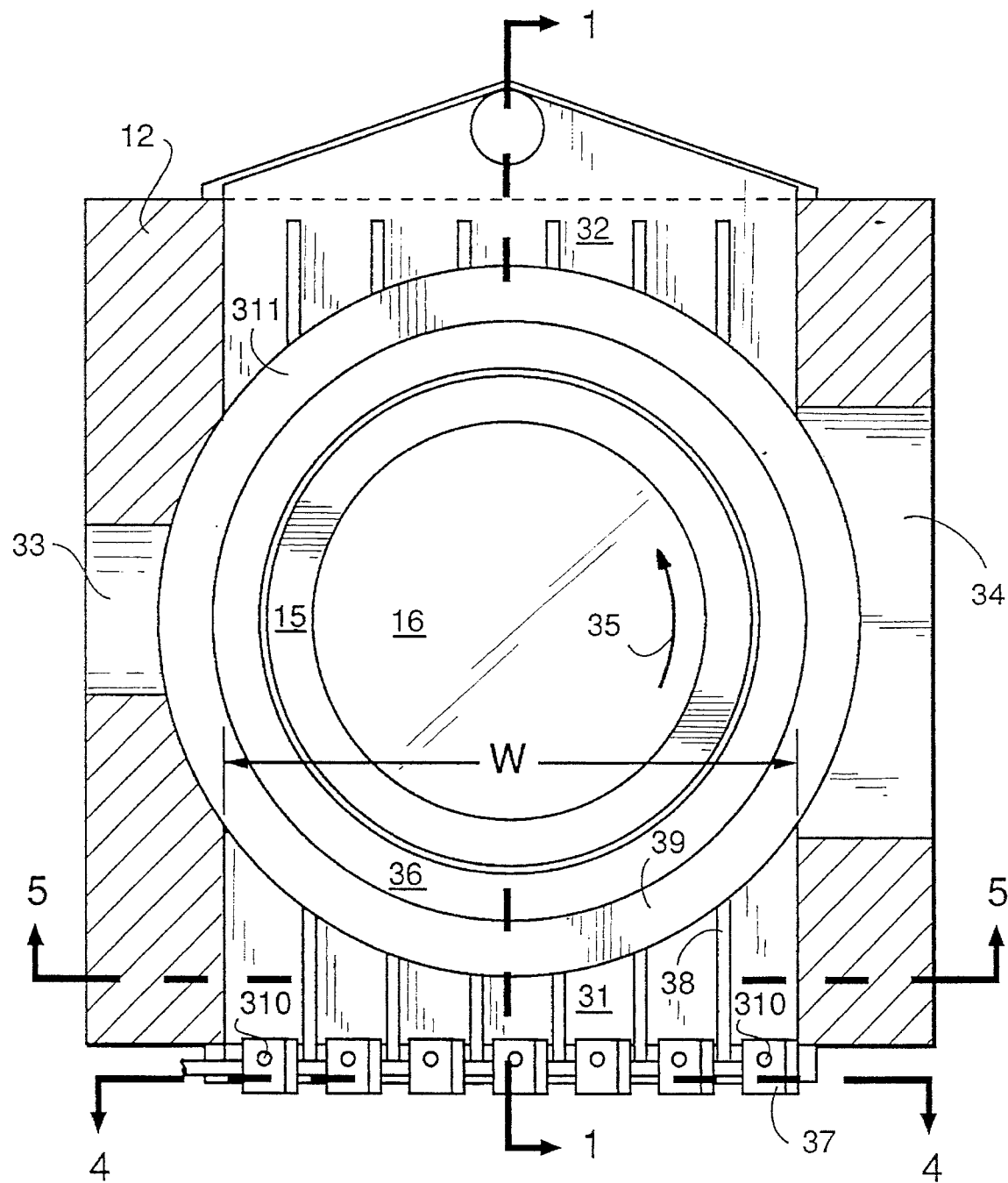
FIG. 3 is a top cross-sectional view of the wafer processing reactor of FIG. 1 through a plane containing a gas inlet port and a gas exhaust port.
Figure 4:
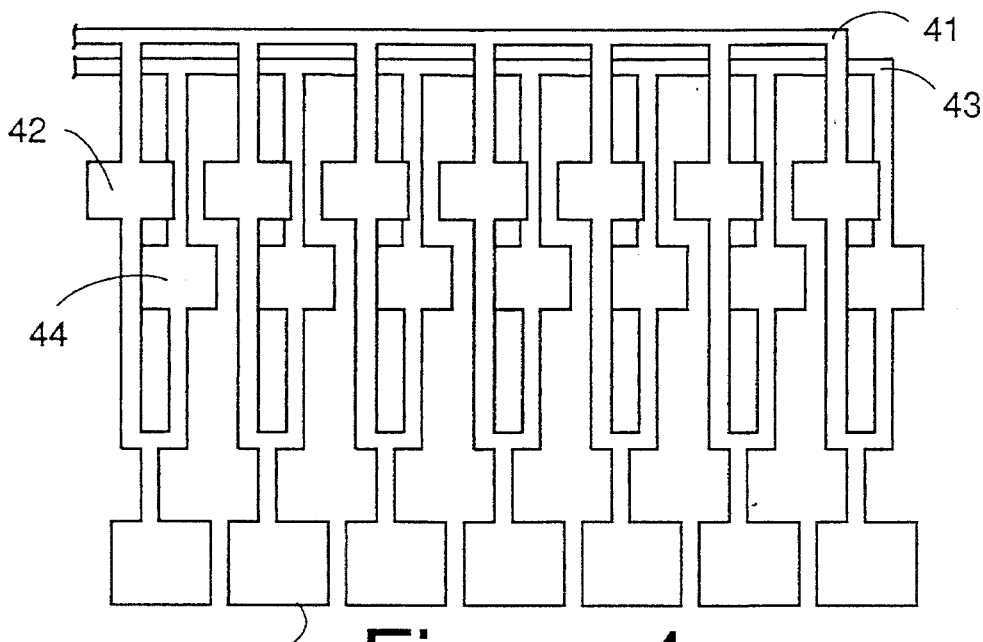
FIG. 4 is a side view of the gas supply manifold, as indicated in FIG. 3.

FIG. 3 is a top cross-sectional view of the wafer processing reactor of FIG. 1 through a plane containing a gas inlet port 31 and a gas exhaust port 32. A hole 33 is included for use by various pieces of equipment such as a thermocouple to measure the gas temperature within reaction chamber 14. A slot 34 enables wafers to be transmitted into and out of the reaction chamber. Arrow 35 illustrates that pedestal 15 and wafer 16 are rotated about an axis A that is substantially centered on the wafer and is substantially perpendicular to a top surface of the wafer. A preheat ring susceptor 36 is included to provide heating of injected gases before they reach the wafer. Although this can be achieved by a preheat susceptor that does not encircle the wafer, it is advantageous to encircle the wafer so that it experiences a more uniform processing environment. This preheat ring susceptor 36 is opaque to the light from lamps 17 and, in this embodiment, is silicon carbide coated graphite. Reactant and carrier gases are supplied into gas inlet port 31 by a gas supply manifold 37 that is illustrated in greater detail in FIG. 4.

In this embodiment the gas supply manifold 37 supplies only a pair of different gases. A first of these gases is supplied from a first gas source to a first pipe 41 and a second of these gases is supplied from a second gas source to a second pipe 43. Each of these two pipes splits into seven pipes, each provided at one of a set of inlets 310 to a different channel 51 (illustrated in FIG. 5 and discussed below in regard to that figure) of the gas inlet port 31. Between pipe 41 and each of the seven pipes from it to the gas inlet port channels is an associated flow controller 42. Similarly, between pipe 43 and each of the seven pipes from it to the gas inlet port channels is an associated flow controller 44. This enables the flow rate of each of these two gases to each of the seven channels to be independently controlled. The concentrations in the channels are then determined by the mix of these two gases in these channels and by the concentrations of these two gases. In other embodiments more than two pipes such as 41 and 43 can be provided to enable more control over the gas flow and concentration. For example, various carrier gases as well as multiple reactant gases can be provided. Also, fewer or greater than 7 channels can be utilized to distribute these gases.

Figure 5:
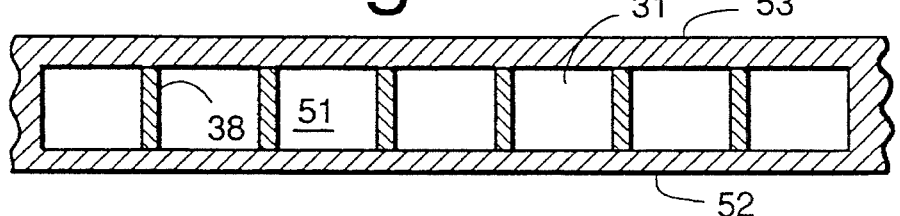
FIG. 5 is a side view cross-section of the gas inlet port, as indicated in FIG. 3.
Figure 6:
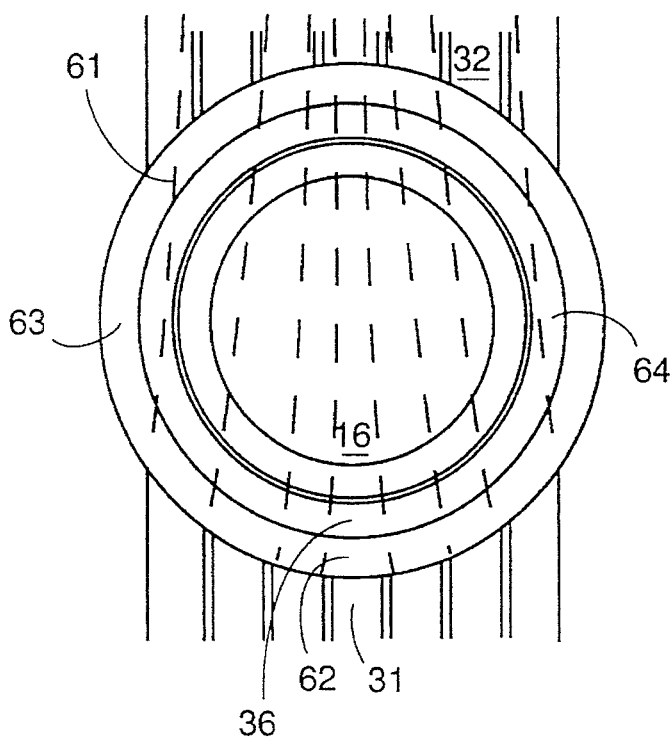
FIG. 6 illustrates flow streamlines of gas from the gas inlet port to the gas outlet port.

FIG. 5 is a side view cross-section of the gas inlet port 31. A set of vanes 38 extend from a bottom wall 52 to a top wall 53 of the gas inlet port and provides support for the gas inlet port. These vanes also divide the gas inlet port into a set of seven channels 51 that provide the ability to prevent mixing of injected gases until a point closer to the edge of the wafer being processed. This enables greater control over the flow and concentration profiles of reactant and carrier gases across the top surface of the wafer. A typical flow profile is illustrated in FIG. 6 by dashed lines 61 that indicate boundary lines between the gas flow from adjacent channels 51. This flow profile can be altered by altering the total gas flow through each of these seven channels 51. The reaction process can also be altered by changing the relative mix of gases through each of these channels.

As is illustrated in FIG. 3, between the ends of the vanes 38 and the wafer is a thin slit 39 through which the reactant and carrier gases pass before entering the reactor chamber. Because the vanes do not extend into this region, the gases from adjacent channels can begin to mix, thereby smoothing out the concentration and flow profiles before these gases reach the vicinity of the wafer. This narrow slit has a width W as wide as the width of the gas inlet port 31 within the region containing the vanes. The height (i.e., the dimension of this slit perpendicular to the view of FIG. 3) is on the order of 3 mm so that the gases are injected into a region of small height at the wafer edge. This produces an efficient utilization of the reactant gases because this thin region will tend to flow uniformly across the reaction chamber to the exhaust port.

In general, a greater flux of reactants is required in the middle channels so that a relatively higher flux results near the center of the wafer than at the perimeter. This higher flux is required in these channels because the concentration is partially depleted as it passes over the peripheral region of the wafer and on to the central portion. Furthermore, the peripheral regions of the wafer interact not only with the gas from the inner channels, but also interact within regions 63 and 64 with gases supplied through the outer channels.

The complicated interaction between heating effects, rotation of the wafer, flow rates, concentrations, backflow of gases in the rotating wafer system, temperature, decomposition of the gases, thermal convection and complex reactions between the reactant gases and the wafer make it extremely difficult to accurately predict what combination of flow rates and concentrations will be optimal, so theoretical considerations will generally be only a starting point for the selection of the gas flow rates and concentrations through each of the channels. Because the wafer surface is heated by light from lamps 17, local convection cells can dominate local flow patterns. Empirical measurements will almost always be required to optimize the process. FIG. 7 illustrates a typical set of such empirical data.

This figure represents the process of silicon deposition and displays the thickness (in microns), as a function of radial distance from the center of the wafer, of the resulting layer produced on the wafer. In the top left corner is indicated the total flow rate within each of the seven channels. Only four numbers are indicated since a symmetric pattern of relative flow rates is utilized in these tests. Thus, for the top curve, the first and seventh channels (i.e., the outermost channels) have zero gas flow, the second and sixth channels (i.e., the 2nd outermost channels) have a flow rate of 4, the third and fifth channels have a flow rate of 4.5 and the fourth channel (i.e., the central channel) has a flow rate of 5. This plot shows that the expected result that the first and seventh channels have a strong effect on the deposition over the outer regions of the wafer. Somewhat surprisingly, the third and fourth of these curves show that the flow in the third and fifth channels has a greater effect on the thickness at the center of the wafer than does the flow rate in the central channel.

In a typical process, the total flow rate through gas inlet 19 is on the order of 8 liters per minute and the total flow rate through gas inlet port is on the order of 20–30 liters per minute. Optimal uniformity for the process of silicon deposition was achieved for relative flow rates of 11, 9, 10, 10, 10, 9, and 11 in channels 1–7, respectively. This choice produces a better uniformity than when all of these flow rates are equal. Micrometering valves and fixed orifices are utilized as flow controllers 42 and 44 to control flow rate. Other devices for controlling flow rates include mass flow controllers or other variable restrictors.

In the embodiment of FIGS. 1–6, vanes 38 are all parallel and are directed straight ahead as can be seen in FIGS. 3 and 6. In alternate embodiments, the directions of these vanes can also be an adjustable process parameter. Vanes can also be placed in the slit area 39 of the inlet or the exhaust 311 to alter the flow pattern. Other variations include changes in the flow channel width W relative to the other dimensions or altering the number of flow channels used in the inlet independent of the number used in the exhaust.

We claim:

1. A method for processing a substrate mounted horizontally within a reaction chamber comprising the steps of:

mounting a substrate within said chamber, directing a plurality of streams of a processing gas across and parallel to a surface of said substrate which is rotating during processing, and separately controlling respective flows of said plurality of gas streams wherein a higher flux of processing gas is directed at the center of the substrate than at the perimeter of the substrate.

2. A method according to claim 1 wherein said processing gases are preheated before they reach the substrate.

* * * * *